United States Patent [19]

Mertesdorf et al.

[11] Patent Number: 5,663,038
[45] Date of Patent: Sep. 2, 1997

[54] PROCESS FOR THE PREPARATION OF PARTIALLY PROTECTED PHENOLIC RESINS

[75] Inventors: Carl-Lorenz Mertesdorf, Bad Krozingen, Germany; Bertold Nathal, Rodersdorf; Hans-Jorg Kirner, Pratteln, both of Switzerland

[73] Assignee: OCG Microelectronic Materials, Inc., Norwalk, Conn.

[21] Appl. No.: 572,344

[22] Filed: Dec. 14, 1995

[30] Foreign Application Priority Data

Dec. 20, 1994 [CH] Switzerland ............................. 3835/94
Jun. 7, 1995 [CH] Switzerland ............................. 1673/95

[51] Int. Cl.$^6$ ........................................................ G03C 5/00
[52] U.S. Cl. ............................ 430/326; 430/18; 525/242; 525/298; 525/534
[58] Field of Search ................................. 525/534, 242, 525/298; 430/18, 326

[56] References Cited

U.S. PATENT DOCUMENTS 5,356,752  10/1994  Cabrera et al. ........................ 430/270

FOREIGN PATENT DOCUMENTS

| 447868 | 9/1991 | European Pat. Off. . |
| 520642 | 12/1992 | European Pat. Off. . |
| 520654 | 12/1992 | European Pat. Off. . |
| 552548 | 7/1993 | European Pat. Off. . |
| 588544 | 3/1994 | European Pat. Off. . |
| 628876 | 12/1994 | European Pat. Off. . |
| WO 94/14858 | 7/1994 | WIPO . |

OTHER PUBLICATIONS

European Search Report for European Patent Application EP 95 30 9071 dated Apr. 25, 1996.

*Primary Examiner*—Terressa Mosley
*Attorney, Agent, or Firm*—William A. Simons; Wiggin & Dana

[57] ABSTRACT

A process for the preparation of phenolic resins having acid-labile acetal or ketal protecting groups by reacting a phenolic resin with an enol ether in the presence of an acidic catalyst and subsequently treating the reaction mixture with a basic anion exchanger gives heat-resistant polymers which, in combination with acid photogenerators, produce radiation-sensitive compositions of high processing stability with a greatly improved shelf life.

14 Claims, No Drawings

PROCESS FOR THE PREPARATION OF PARTIALLY PROTECTED PHENOLIC RESINS

BACKGROUND OF THE INVENTION

1. Field of the Invention

The present invention relates to a process for the preparation of partially protected phenolic resins by acid-catalyzed reaction of a phenolic resin with an enol ether and subsequent treatment of the reaction mixture with a basic anion exchanger.

2. Brief Description of the Revelant Art

The production of highly integrated circuits currently requires the ability for structures having a width of less than 0.35 μ to be transferred imagewise to the substrate. For this purpose, use is predominantly made of chemically reinforced resist systems which generally comprise alkali-soluble binder resins whose alkali-solubilizing groups, for example, hydroxyl groups, have been blocked by acid-labile protecting groups, thereby rendering the binder resin substantially insoluble in alkali. Exposure then initates a primary reaction of an acid photogenerator which absorbs at the appropriate wavelength, forming a strong acid which, in the subsequent secondary reaction, results in elimination of the protecting groups and thus in re-formation of the solubilizing groups.

One example which may be mentioned of such systems is poly(p-hydroxystyrene) whose phenol groups are protected by, for example, tertbutyloxycarbonyloxy (TBOC) or tetrahydropyranyl (THP) groups (see for example: M. J. Bowden and S. R. Turner (eds.) "Electronic and Photonic Application of Polymers", ACS Series 218, Washington 1988; and N. Hayashi et al., Polymer 33, 1583 (1992)). These polymers, however, have disadvantages in respect of adhesion to silicon.

Attempts have already been made to improve adhesion, reproducibility and resolution by using in the resist formulations a binder resin whose phenolic hydroxyl groups have been replaced only partially by acid-cleavable protecting groups. One example of these attempts is EP-A 447,868, which proposes a radiation-sensitive mixture whose phenolic resin is partially protected by tetrahydropyranyl groups.

It is known that, in partially protected polymers having free phenolic monomer units, there is an increased occurrence of losses of thermal stability. The thermally induced decomposition can be attributed to partial deprotection which is caused in turn by the catalytic effect of the weakly acidic phenolic hydroxyl groups.

A partial protection provided by reacting the phenolic resin with the protecting-group reagent in the presence of catalytic quantities of acid is described, for example, in EP-A 447,868. The polymers prepared are isolated by introducing the polymer solutions obtained directly after the protection reaction into a precipitating agent.

The resists known to date have been unable to solve with satisfaction the problem of inadequate thermal stability. In systems containing very acid-labile protecting groups in particular, such as acetal and ketal protecting groups, the shelf life falls short of what is required. However, it is precisely acetal and ketal protecting groups which are preferred, since with the chemically reinforced resists they permit a greater processing scope than the less acid-labile protecting groups, for example the tert-butoxycarbonyloxy (TBOC) group or the ter-butyl ester protecting group.

The object of the present invention is to develop a process for the preparation of heat-resistant polymers and to provide positive-working, highly active, radiation-sensitive systems, in particular for the production of relief structures, which systems do not have the abovementioned disadvantages; in other words, they should in particular possess good adhesion and processing stability, be sensitive to UV radiation, electron beams and X-rays and should in particular possess good storage stability (shelf life) and permit high resolution.

WO 94/14858 describes a positive photoresist composition based on poly(hydroxystyrene), whose content of metal ions and chloride ions has been drastically reduced by purification with an anion exchanger.

BRIEF SUMMARY OF THE INVENTION

Surprisingly, it has now been found that radiation-sensitive mixtures which comprise a phenolic resin having acid-labile acetal or ketal protecting groups do not have the disadvantages described above if the phenolic resin is treated, after the protection reaction, with a basic anion exchanger.

The present invention relates to a process for the preparation of phenolic resins having acid-labile acetal or ketal protecting groups by reacting a phenolic resin with an enol ether in the presence of an acidic catalyst and subsequently treating the reaction mixture with a basic anion exchanger.

DETAILED DESCRIPTION OF PREFERRED EMBODIMENTS

The term "phenolic resin" in the context of the present invention refers to all alkali-soluble polymers containing phenolic groups which are know to the person skilled in the art. These may be homopolymers, such as poly(4-hydroxystyrene), poly(4-hydroxy-α-methylstyrene), poly(3-hydroxystryrene), halo- or alkyl-substituted poly(4-hydroxystyrene), or copolymers formed from phenolic vinyl monomers and other monomer units, such as, for example, acrylic acid, methacrylic acid, alkyl methacrylate, alkyl acrylate, styrene, fumaronitrile, 4-vinylcyclohexanol, maleic anhydride or maleinimide and derivates thereof. Examples of other suitable phenolic resins are novolak resins and partially hydrogenated novolak resins.

In the process according to the invention it is preferred to use phenolic resins comprising hydroxystyrene units, especially p-hydroxystyrene units.

The enol ethers which are preferably used in the process according to the invention are the compounds of the formula I:

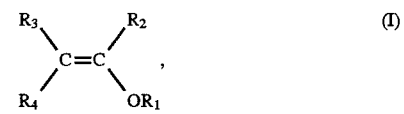

in which $R_1$ is $C_1$–$C_6$alkyl, $C_5$–$C_{14}$aryl, $C_6$–$C_{20}$aralkyl or $C_3$–$C_6$cycloalkyl, $R_2$, $R_3$ and $R_4$ independently of one another are hydrogen, $C_1$–$C_6$alkyl, $C_5$–$C_{14}$aryl, $C_6$–$C_{20}$aralkyl or $C_3$–$C_{12}$cycloalkyl, or $R_2$ and $R_3$ or $R_3$ and $R_4$, together with the carbon atoms attached to these radicals, form a five- to eight-membered ring which can if desired comprise further heteroatoms or heterogroups such as —O—, —S—, —SO$_2$— or —NR$_5$—, where $R_5$ is $C_1$–$C_6$alkyl, $C_5$–$C_{14}$aryl or $C_6$–$C_{20}$aralkyl, as ring members, or $R_1$ and $R_4$, together with the oxygen and carbon atoms attached to these radicals, form a five- to eight-membered ring which can if desired comprise further heteroatoms or heterogoups such as —O—, —S—, —SO$_2$— or —NR$_5$—, where R$_5$ is C$_1$–C$_6$alkyl, C$_5$–C$_{14}$aryl or C$_6$–C$_{20}$aralkyl, as ring members.

Alkyl group substituents R$_1$ to R$_5$ can be linear or branched. Examples are methyl, ethyl, n-propyl, isopropyl, n-butyl, sec-butyl, isobutyl, tert-butyl, n-pentyl, neopentyl, isopentyl, n-hexyl and isohexyl.

Cycloalkyl group substituents R$_1$ to R$_4$ are for example cyclopropyl, cyclopentyl or cyclohexyl.

Examples of aryl groups are phenyl, tolyl, mesityl, xylyl, isityl, naphthyl and anthryl.

Aralkyl groups are preferably benzyl or phenylethyl.

It is preferred to employ a compound of the formula I in which R$_3$ is hydrogen and R$_2$ is hydrogen or methyl.

Particularly preferred compounds of the formula I are those in which R$_1$ is methyl, ethyl, n-propyl, isopropyl, n-butyl, isobutyl, tert-butyl or cyclohexyl, or R$_1$ and R$_4$, together with the oxygen and carbon atoms attached to these radicals, form a tetrahydrofuranyl or tetrahydropyranyl ring.

The acid-catalyzed reaction of phenolic hydroxyl groups with enol ethers is a familiar reaction for the introduction of acetal or ketal protecting groups. The reaction conditions and appropriate catalysts are known to the person skilled in the art and are described, for example, in Houben-Weyl—"Methoden der Organischen Chemie" [Methods of Organic Chemistry], Volume E14a/1, pages 323 ff. (1991).

Examples of suitable catalysts are Bronstedt acids, such as hydrochloric acid, sulfuric acid, phosphoric acid, hydrobromic acid, carboxylic and sulfonic acids, especially p-toluene-sulfonic acid, and also compounds which are acidic and/or which can be hydrolyzed easily to liberate acids, and Lewis acids, for example, phosphorus oxychloride, boron trifluoride and aluminum chloride.

In the purification step which follows the protection reaction, it is possible in principle to employ any basic anion exchangers which are known to the person skilled in the art, with the use of both inorganic and organic anion exchangers being possible.

Examples of inorganic anion exchangers are apatite, hydroxyapatite or anion exchangers based on inorganic oxides, such as silica gel or alumina. It is also possible to use amphoteric exchangers, in which both anions and cations are exchanged in the same crystal, examples being kaolinite or montmorillonite.

Organic anion exchangers are generally organic polymers which have been modified by the incorporation of solid ions. A distinction is made in this context between strongly basic anion exchangers, which feature —NR$_3^+$groups as solid ions, and weakly basic anion exchangers having —NHR$_2^+$—, —NH$_2$R$^+$, or —NH$_3^+$groups, where R is unsubstituted or substituted alkyl or aryl.

In the process according to the invention, it is preferred to use strongly basic anion exchangers.

The most common ion exchanger resins are styrene/divinylbenzene copolymers or acrylamide/divinylbenzene copolymers.

A further distinction is made between ion exchangers in gel form (microporous ion exchangers) having pore sizes of up to 2 nm, and macroporous ion exchangers having pore sizes >2 nm, the latter being preferred in the context of this invention.

Examples of suitable ion exchanger resins are the following commercially available products: Amberlyst®, Amberlite® (Rohm & Haas), Diaion® (Mitsubishi), Dowex® (Dow), Duolite® (Diamond Shamrock), Imac® (Akzo), Ionac® (Sybron), Kastel® (Montecatini), Lewatit® (Bayer), Permutit® (Permutit), Relite® (Resin d'lon), Varion® (Chemolimpex), Wofatit® (VEB Bitterfeld) and Zerolit® (Zerolit).

The reaction mixture can be treated with the anion exchanger either by the batch method or by the column method.

In the case of the batch method, the ion exchanger resin is placed in the reaction solution and the mixture is shaken thoroughly until an equilibrium state has becom established. The exchanger resin is then filtered off and washed out, and can be regenerated for the next batch. If desired, this operation is repeated.

It is more expedient to use the column process, since the effect obtained is comparable with that achieved by numerous repeat operations in the batch method. According to this method, the reaction solution passes, generally from top to bottom, through a column which is packed with the exchanger resin. In order to pack a column with ion exchanger, the latter is advantageously first of all treated with a swelling agent. The swollen ion exchanger is washed into the column and then rinsed with the solvent. The swelling agent is advantageously the same as the solvent in which the protection reaction is carried out.

The phenolic resins prepared by the process according to the invention are distinguished by an unexpectedly high decomposition temperature and a long shelf life.

In combination with acid photogenerators, the phenolic resins prepared by the process according to the invention form radiation-sensitive compositions which, in comparison with the photoresist systems known to date, exhibit increased process stability and a greatly improved shelf life.

Because of the very high resolution capacity, these resist compositions are particularly suitable for the production of highly integrated circuits.

The examples which follow illustrate the invention. All parts and percentages are by weight and temperature are degree Celsius unless explicity stated otherwise.

SYNTHESIS EXAMPLE 1

Preparation of poly[4-(1-methoxy-1-methylethoxy) styrene/4-(1-methoxy-1-methylethoxy)-vinylcylohexane/4-hydroxystyrene/4-viylcyclohexanol]

24.0 g of 2-methoxypropene are slowly added dropwise at 10° C. to a solution of 20.0 g of partially hydrogenated poly-4-hydroxystyrene (Maruka Lyncur PHM-C, content of cycloaliphatic structural units about 10 mol %), a catalytic quantity of 4-toluenesulfonic acid and a catalytic quantity of pyridine in 140 ml of 1,4-dioxane. The reaction mixture is stirred at room temperature for 24 h; the reaction solution is subsequently eluted slowly through a column into which 50.0 g of a strongly basic macroporous anion exchanger based on sytrene/divinylbenzene copolymer (Amberlyst® A-26) have been washed. The polymer is precipitated by introducing the reaction solution into a mixture of water and isopropanol, filtered off with suction, washed with a mixture of water and isopropanol and dried to constant weight. 24.0 g of poly[4-(1-methoxy-1-methylethoxy)styrene/4-(1-methoxy-1-methylethoxy)vinylcyclohexane/4-hydroxystyrene/4-vinylcyclohexanol] are obtained, in which according to thermogravimetric analysis (TGA) 65 mol % of the original OH groups have been protected.

Decomposition temperature:
onset: 151° C., peak:
161° C. (TGA, heating rate 10° C./min)

SYNTHESIS EXAMPLE 2 (Comparison)

Similarly to Synthesis Example 1, 20.0 g of partially hydrogenated poly-4-hydroxystyrene (Maruka Lyncur PHM-C) and 24.0 g of 2-methoxypropene are used to prepare 23.0 g of poly[4-(1-methoxy-1-methylethoxy)styrene/4-(1-methoxy-1-methylethoxy)vinylcyclohexane/4-hydroxystyrene/4-vinylcyclohexanol], but the treatment of the polymer solution with the anion exchanger is omitted. According to TGA analysis, 65 mol% of the OH groups have been protected.

Decomposition temperature:

onset: 125° C., peak:

148° C. (TGA, heating rate 10°C./min)

SYNTHESIS EXAMPLE 3

Similarly to Synthesis Example 1, 20.0 g of partially hydrogenated poly-4-hydroxystyrene (Maruka Lyncur PHM-C), a catalytic quantity of 4-toluenesulfonic acid and 10.0 g of ethyl vinyl ether are used to prepare 19.0 g of poly[4-(1-ethoxyethoxy)styrene/4-(1-ethoxyethoxy)-vinylcyclohexane/4-hydroxystyrene/4-vinylcyclohexanol], in which according to TGA analysis 37 mol% of the OH groups have been protected.

Decomposition temperature:

onset: 243° C., peak:

270° C. (TGA, heating rate 10° C./min)

After 200 min at 120° C., a loss in mass of 1.3% by autocatalytic decomposition is recorded.

SYNTHESIS EXAMPLE 4 (Comparison)

Similarly to Synthesis Example 1, 20.0 g of partially hydrogenated poly-4-hydroxystyrene (Maruka Lyncur PHM-C), a catalytic quantity of 4-toluenesulfonic acid and 10.0 g of ethyl vinyl ether are used to prepare 18.0 g of poly[4-(1-ethoxyethoxy)styrene/4-(1-ethoxyethoxy)-vinylcyclohexane/4-hydroxystyrene/4-vinylcyclohexanol], the treatment of the polymer solution with the anion exchanger being omitted. According to TGA analysis, 37 mol% of the OH groups have been protected.

Decomposition temperature:

onset: 132° C., peak:

141° C. (TGA, heating rate 10 ° C./min)

After 200 min at 120° C., a loss in mass of 7.0% by autocatalytic decomposition is recorded.

While the invention has been described above with reference to specific embodiments thereof, it is apparent that many changes, modifications, and variations can be made without departing from the inventive concept disclosed herein. Accordingly, it is intended to embrace all such changes, modifications, and variations that fall within the spirit and broad scope of the appended claims. All patent applications, patents, and other publications cited herein are incorporated by reference in their entirety.

What is claimed is:

1. A process for preparing a purified phenolic resin comprising the steps of:
   (1) reacting a phenolic resin with an enol ether in the presence of an acidic catalyst, thereby forming a reaction mixture comprising a converted phenolic resin of which at least a portion of the hydroxyl groups of the phenolic resin have been converted to acid-labile acetal or ketal protecting groups; and
   (2) subsequently treating said reaction mixture with a basic anion exchanger.

2. The process of claim 1, wherein said phenolic resin comprises hydroxystyrene units.

3. The process of claim 1, wherein said phenolic resin comprises p-hydroxystyrene units.

4. The process of claim 1, wherein said phenolic resin comprises both 4-hydroxystyrene and 4-vinylcyclohexane units.

5. The process of claim 1, wherein said enol ether is a compound of formula (I):

in which $R_1$ is selected from the group consisting of $C_{1-6}$alkyl, $C_5$–$C_{14}$ aryl, $C_6$–$C_{20}$ aralkyl and $C_3$–$C_{12}$ cycloalkyl; in which $R_2$, $R_3$ and $R_4$, independently of one another, are selected from the group consisting of hydrogen, $C_1$–$C_6$ alkyl, $C_5$–$C_{14}$ aryl, $C_6$–$C_{20}$ aralkyl and $C_3$–$C_{12}$ cycloalkyl; or $R_2$ and $R_3$, or $R_3$ and $R_4$, together with the carbon atoms attached to those radicals, form a five-to-eight-membered ring; or $R_1$ and $R_4$, together with the oxygen and carbon atoms attached to these radicals, form a five-to-eight-membered ring.

6. The process of claim 5, wherein said enol ether is a compound of formula (I) wherein either $R_2$ and $R_3$ or $R_3$ and R4, together with the carbon atoms attached to these radicals, form a five-to-eight-membered heterocyclic ring having further ring members selected from the group consisting of —O—, —S—, —SO$_2$— and —NR$_5$—where $R_5$ is selected from the group consisting of $C_1$–$C_6$ alkyl, $C_5$–$C_{14}$ aryl and $C_6$–$C_{20}$ aralkyl.

7. The process of claim 5, wherein said enol ether is a compound of formula (I) and wherein $R_1$ and $R_4$ together, with the oxygen and carbon atoms attached to these radicals, form a five-to-eight-membered heterocyclic ring having further ring members selected from the group consisting of —O—, —S—, —SO$_2$—and —NR$_5$ wherein $R_2$ is $C_1$–$C_6$ alkyl, $C_5$–$C_{14}$ aryl or $C_6$–$C_{20}$ aralkyl.

8. The process of claim 7, wherein said enol ether is a compound of formula (I) and $R_1$ and $R_4$, together with oxygen and carbon atoms attached to these radicals, form a tetrahydrofuranyl or tetrahydropyranyl ring.

9. The process of claim 5, wherein said enol ether is a compound of formula (I) in which $R_3$ is hydrogen and $R_2$ is hydrogen or methyl.

10. The process of claim 5, wherein said enol ether is a compound of formula (I) in which $R_1$ is selected from the group consisting of methyl, ethyl, n-propyl, isopropyl, n-butyl, isobutyl, tert-butyl and cyclohexyl.

11. The process of claim 10, wherein said acid catalyst is selected from the group consisting of hydrochloric acid, sulfuric acid, phosphoric acid, hydrobromic acid, p-toluenesulfonic acid, phosphorus oxychloride, boron trifluoride and aluminum chloride.

12. The process of claim 11, wherein said acid catalyst is p-toluenesulfonic acid.

13. The process of claim 1, wherein said basic anion exchanger is a strongly basic anion exchanger having —NR$_3^+$ groups as solid ions, where R is an unsubstituted or a substituted alkyl or aryl group.

14. The process of claim 1, wherein said basic anion exchanger is a macroporous ion exchanger having a pore size >2 nm.

* * * * *